(12) United States Patent
Hosono et al.

(10) Patent No.: US 7,662,357 B2
(45) Date of Patent: Feb. 16, 2010

(54) HYDROGEN-CONTAINING ELECTRICALLY CONDUCTIVE INORGANIC COMPOUND

(75) Inventors: Hideo Hosono, Yamato (JP); Masahiro Hirano, Tokyo (JP); Katsuro Hayashi, Kawasaki (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 761 days.

(21) Appl. No.: 10/511,715

(22) PCT Filed: Apr. 18, 2003

(86) PCT No.: PCT/JP03/05016

§ 371 (c)(1),
(2), (4) Date: Mar. 25, 2005

(87) PCT Pub. No.: WO03/089373

PCT Pub. Date: Oct. 30, 2003

(65) Prior Publication Data

US 2005/0279279 A1  Dec. 22, 2005

(30) Foreign Application Priority Data

Apr. 19, 2002 (JP) .............................. 2002-117314

(51) Int. Cl.
*C01F 7/00* (2006.01)
(52) U.S. Cl. .................................... 423/447.1; 423/650
(58) Field of Classification Search ............... 423/447.1
See application file for complete search history.

(56) References Cited

FOREIGN PATENT DOCUMENTS

WO   WO 01/79115   10/2001
WO   WO 03/050037   6/2003

OTHER PUBLICATIONS

M. Lacerda et al.; Solid Sate Ionics, vol. 59, pp. 257-262, 1993. Cited in the PCT search report.
Katsuro Hayashi et al.; Nature, vol. 419, No. 6909, pp. 462-465, Oct. 3, 2002. Cited in the PCT search report.
A. F. Th. Hoekstra et al.; Physical Review Letters, vol. 86, No. 23, pp. 5349-5352, Jun. 4, 2001. Cited in the specification.
V. H. Bartl et al.; N. Jahrbuch f. Minerologie. Monatshefre 1970, vol. 35, pp. 547-552. Cited in the specification.
H. Hosono et al.; American Chemical Society, vol. 26, No. 8, pp. 1193-1195. 1987. Cited in the specification.
O. Yamaguchi et al.; Communications of the American Ceramic Society, vol. 69, pp. C-36-37, 1986. Cited in the specification.
Patent Abstract of Japan, No. 2003-128415, of May 8, 2003. Cited in the PCT search rpt.
Patent Abstract of Japan, No. 2002-003218, of Jan. 9, 2002. Cited in the specification.
Patent Abstract of Japan, No. 2003-040697, of Feb. 13, 2003. Cited in the specification.
Patent Abstract of Japan, No. 2002-316867, of Oct. 31, 2002. Cited in the specification.
Patent Abstract of Japan, No. 2003-238149, of Aug. 27, 2003. Cited in the specification.

*Primary Examiner*—Melvin C Mayes
*Assistant Examiner*—Kenneth Vaden
(74) *Attorney, Agent, or Firm*—Westerman, Hattori, Daniels & Adrian, LLP

(57) ABSTRACT

Disclosed is a $12CaO.7Al_2O_3$ compound, a $12SrO.7Al_2O_3$ compound, or a mixed crystal compound of $12CaO.7Al_2O_3$ and $12SrO.7Al_2O_3$, which contains a negative hydrogen ion ($H^-$, $H^{2-}$, $H_2^-$) at a concentration of $1\times10^{18}$ cm$^{-3}$ or more. A negative hydrogen ion comprising a primary component of a hydride ion is incorporated into C12A7 ($12CaO.7Al_2O_3$), so that a function of being converted from an insulative material to an electrically conductive material in a sustained manner by means of irradiation with light can be exhibited even in the normal atmosphere at a room temperature. The present invention also provides a solid electrolyte capable of conducting a negative hydrogen ion, and means for releasing a hydride ion from the inside of a solid into a gaseous phase using an electric field.

9 Claims, 5 Drawing Sheets

HYDROGEN-CONTAINING ELECTRICALLY CONDUCTIVE INORGANIC COMPOUND

TECHNICAL FIELD

The present invention relates to a $12CaO.7Al_2O_3$ compound (hereinafter referred to as "C12A7"), a $12SrO.7Al_2O_3$ compound (hereinafter referred to as "S12A7"), or a mixed crystal compound of $12CaO.7Al_2O_3$ and $12SrO.7Al_2O_3$, which contains a negative hydrogen ion. The present invention also relates to a production method for these compounds, and the uses of these compounds.

BACKGROUND ART

Heretofore, there has been known only a few solid inorganic materials capable of being converted from their normal state or an insulative material to an electrically conductive material by means of irradiation with light. Recently, as one of the few cases, it was reported that yttrium hydride ($YH_x$) or lanthanum hydride ($LaH_x$) can be converted from an insulative state to an electrically conductive material in a sustained manner by means of irradiation with ultraviolet ray (A. F. Th. Hoekstra et al., Phys. Rev. Lett. 86[23], 5349, 2001).

In 1970, H. B. Bartl et al. found out that a C12A7 crystal has an unique feature in which among 66 oxygens residing in a unit cell including two molecules, two oxygens are not included in a network but exist as "free oxygens" in the inner space of cages residing in the crystal (H. B. Bartl and T. Scheller, Neues Jahrb. Mineral., Monatsh. 1970, 547). Until now, it has been verified that the free oxygens can be substituted with various types of negative ions.

Based on the measurement of electron spin resonance, Hosono who is one of the inventors of the present invention, et al. found out that $CaCO_3$ and $Al_2O_3$ or $Al(OH)_3$ can be used as a raw material and synthesized through a solid-phase reaction at a temperature of 1200° C. in the air to obtain a C12A7 crystal clathrateing $O_2^-$ at a concentration of about $1\times10^{19}$ $cm^{-3}$. They proposed a model such that a part of free oxygens exists within crystal cages in the form of $O_2^-$ (H. Hosono and Y. Abe, Inorg. Chem. 26[8], 1193, 1987, pp. 171-172, 1996, *Materials Science Society of Japan*).

The inventors newly found out that a raw material prepared by mixing calcium and aluminum at the atomic equivalence ratio of about 12:14 can be subjected to a solid-phase reaction under a controlled temperature and atmosphere to obtain a C12A7 compound incorporating active oxygen species at a high concentration of $10^{20}$ $cm^{-3}$ or more. The inventors filed a patent application for inventions concerning the compound itself, a production method therefor, means for extracting incorporated ions, a method for identifying the active oxygen ion radicals, and the uses of the compound [Japanese Patent Application No. 2001-049524 (Patent Laid-Open Publication No. 2002-003218), PCT/JP01/03252 (WO0179115-A1)].

Subsequently, the inventors found out a method of controlling the concentration of an anion other than a negative oxygen ion, such as $OH^-$ ion in a C12A7, to incorporate or extract active oxygen species at about 700° C., and filed a patent application for inventions related thereto [Japanese Patent Application No. 2001-226843 (Patent Laid-Open Publication No. 2003-040697)]. The inventors also found out that a electric field can be applied to a C12A7 compound containing an active oxygen at a high concentration to extract a high-density $O^-$ ion beam, and filed a patent application for inventions related thereto [Japanese Patent Application No. 2001-377293 (WO 03/050037A1)].

Furthermore, the inventors found out that a C12A7 compound powder subjected to a hydration reaction in water, water-containing solvent or water-vapor-containing gas can be burnt in an oxygen atmosphere to synthesize a C12A7 compound containing an $OH^-$ ion at a concentration of $10^{21}$ $cm^{-3}$ or more, and filed a patent application for inventions concerning the compound itself, a production method therefor, a method for identifying the $OH^-$ ion, and the uses of the compound [Japanese Patent Application No. 2001-117546 (Patent Laid-Open Publication No. 2002-316867)].

A $12SrO.7Al_2O_3$ compound (S12A7) is known as a material having a crystal structure similar to that of a C12A7 compound (O. Yamaguchi et al. J. Am. Ceram. Soc. 69.[2] C-36, 1968). As to a S12A7 compound, the inventors also filed a patent application for inventions concerning a synthetic method therefor, a method for incorporating an active oxygen ion and the uses of the compound [Japanese Patent Application No. 2002-045302 (Japanese Patent Publication No. 2003-0238149)].

DISCLOSURE OF INVENTION

The aforementioned yttrium hydride ($YH_x$) and lanthanum hydride ($LaH_x$) have difficulties in practically utilizing their electrically conductive properties, due to the need for maintaining them at a low temperature of 200 K or less to assure their electrically conductive state in a sustained manner, and very poor stability causing rapid decomposition in the normal atmosphere.

Through various researches on new possible negative ions to be introduced in C12A7, the inventors found out that a C12A7 compound held in a high-temperature hydrogen flow is stained green by irradiation with ultraviolet ray, wherein in concurrence with the coloring, the $12CaO.7Al_2O_3$ compound, which is originally an insulative material, is converted to an electrically conductive material in a sustained manner, and then the electrically conductive state can be re-converted to the original insulative state by means of heating or irradiation with strong visible light.

As the result of further studies, it was proved that this phenomenon is originated from a negative hydrogen ion introduced in the C12A7 crystal. It was also found that the negative hydrogen ion itself exhibits a high-speed ionic conductance, and the negative hydrogen ion can be extracted into a vacuum space by means of electric filed. In this specification, the generation of a current arising from transfer or migration of electron or negative ion is defined as "electric conductance", wherein if it is clear that either one of electron and negative ion plays a major role in generating a current, it is referred to as "electronic conductance" and "ionic conductance", respectively.

The present invention has been made based on the above knowledge. In the present invention, a negative hydrogen ion ($H^-$, $H^{2-}$, $H_2^-$) comprising a primary component of a hydride ion $H^-$ is incorporated in C12A7 which is a stable solid material capable of incorporating various types of negative ions, to provide a material capable of exhibiting a function of being converted from an insulative material to an electrically conductive material in a sustained manner by means of irradiation with light in the ultraviolet or X-ray region, even in the normal atmosphere at a room temperature.

Specifically, the present invention is as follows.

(1) A $12CaO.7Al_2O_3$ compound, which contains a negative hydrogen ion ($H^-$, $H^{2-}$, $H_2^-$) at a concentration of $1\times10^{18}$ $cm^{-3}$ or more.

(2) A $12SrO\cdot7Al_2O_3$ compound, which contains a negative hydrogen ion ($H^-$, $H^{2-}$, $H_2^-$) at a concentration of $1\times10^{18}$ $cm^{-3}$ or more.

(3) A mixed crystal compound of $12CaO\cdot7Al_2O_3$ and $12SrO\cdot7Al_2O_3$, which contains a negative hydrogen ion ($H^-$, $H^{2-}$, $H_2^-$) at a concentration of $1\times10^{18}$ $cm^{-3}$ or more.

(4) The compound set forth in either one of (1) to (3), which has an electronic conductance equivalent to an electric conductivity of $10^{-5}$ $Scm^{-1}$ or more.

(5) The compound set forth in either one of (1) to (3), which exhibits a sustained increase in electronic conductivity by means of irradiation with ultraviolet ray or X-ray, and has an electric conductivity which is reversibly changed by means of irradiation with light.

(6) The compound set forth in either one of (1) to (3), which has an ionic conductance.

(7) A method of producing the compound set forth in either one of (1) to (3), comprising subjecting either one selected from the group consisting of a $12CaO\cdot7Al_2O_3$ compound, a $12SrO\cdot7Al_2O_3$ compound, and a mixed crystal compound of $12CaO\cdot7Al_2O_3$ and $12SrO\cdot7Al_2O_3$ to a heat treatment at a temperature of 800° C. or more in an atmosphere containing 1000 ppm or more of hydrogen, to thereby incorporate a negative hydrogen ion ($H^-$, $H^{2-}$, $H_2^-$) into the selected compound at a concentration of $1\times10^{18}$ $cm^{-3}$ or more.

(8) A transparent electrode or wiring, which is formed using the compound set forth in (4) or (5).

(9) An optically writable and erasable 3-dimensional electronic circuit and 3-dimensional storage element, which is formed using the compound set forth in (5).

(10) A negative hydrogen ion ($H^-$, $H^{2-}$, $H_2^-$)-conducting solid-electrolyte, which is formed using the compound set forth in (6).

(11) A method of generating a negative hydrogen ion or hydrogen gas, comprising applying a given voltage to the compound set forth in either one of (1) to (3), to thereby extract a negative hydrogen ion from the compound.

BEST MODE FOR CARRYING OUT THE INVENTION

Figure 1:
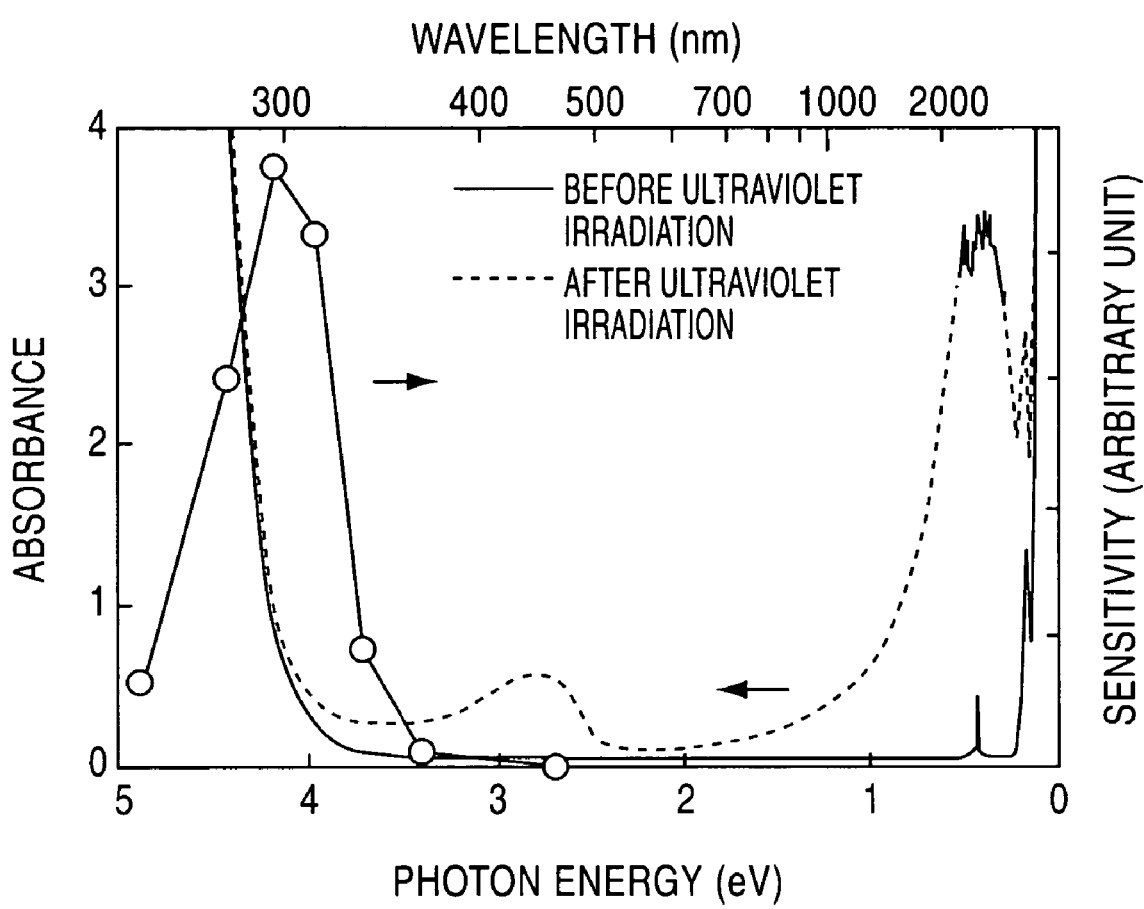
FIG. 1 is a graph showing a light absorption spectrum and the wavelength dependence of light sensitivity in a single crystal obtained in Example 1.

In the present invention, a starting material may be a pure C12A7 compound, or may be a mixed crystal or solid solution having a crystal structure equivalent to that of a C12A7 compound in which a part or all of calcium and aluminum are substituted with a different element (hereinafter referred to as "equivalent material" for brevity), unless the substitution causes destruction of the specific crystal structure of C12A7.

A currently known material having a crystal structure equivalent to that of a C12A7 compound includes $12SrO\cdot7Al_2O_3$, and the mixing ratio between Ca and Sr can be freely changed. That is, the starting material may be a mixed crystal compound of $12CaO\cdot7Al_2O_3$ and $12SrO\cdot7Al_2O_3$. The type and amount of a negative ion initially incorporated in the compound have little influence on the effect of introducing a negative hydrogen ion. The starting material may be prepared in any form, such as powder, film, polycrystal or single crystal.

C12A7 as a starting material is synthesized by preparing a raw material containing calcium (Ca) and aluminum (Al) at the atomic equivalence ratio of 12:14, and subjecting the raw material to a solid-phase reaction at a burning temperature ranging from 1200° C. to less than 1415° C. Typically, the raw material is a mixture of calcium carbonate and aluminum oxide.

A C12A7 single crystal can be obtained through a floating zone (FZ) process using a C12A7 sintered body obtained through a solid-phase reaction, as a precursor. Specifically, the rod-shaped ceramic precursor is pulled upward while focusing infrared light on the precursor to shift a molten zone so as to continuously grow the single crystal along the interface between the molten zone and a solidified portion. The inventors filed a patent application for inventions concerning a C12A7 compound single crystal containing active oxygen species at a high concentration and a method of producing a C12A7 single crystal free of air hole [the aforementioned Patent Application No. 2001-226843 (Patent Laid-Open Publication No. 2003-040697)].

The prepared C12A7 or equivalent material as a starting material is held in an atmosphere containing 1000 ppm or more of hydrogen, preferably the flow of an atmosphere containing 20 volume % of hydrogen without oxygen and water, at a temperature of 800° C. or more, preferably 1000° C. to less than 1350° C., more preferably about 1300° C., for several minutes to several hours depending on the form of the starting material, and then cooled. The atmosphere containing hydrogen may be obtained by filling hydrogen in a vessel made of a material, such as silica glass or tantalum, capable of withstanding a high-temperature heat treatment, and the starting material may be hermetically contained in the vessel. In this case, instead of filling hydrogen gas, a material capable of generating hydrogen through a chemical reaction may be encapsulated together with the starting material. It is to be noted that if a starting material made of pure C12A7 is heated at 1350° C. or more, it will be molten to cause destruction of its original crystal structure.

If the hydrogen in the atmosphere for the heat treatment is set at a concentration of less than 1000 ppm, the concentration of a negative hydrogen ion introduced in the C12A7 or equivalent material will be reduced to less than $1\times10^{18}$ $cm^{-3}$, and therefore intended characteristics of exhibiting an electronic conductance by means of irradiation with ultraviolet ray or X-ray and having an ionic conductance derived from the negative hydrogen ion cannot be adequately obtained. Further, as the temperature for the heat treatment is set at a lower temperature, the hydrogen ion to be introduced in the C12A7 or equivalent material is liable to be alternated with a hydroxyl ion (OH⁻). If the heat-treatment temperature is set at less than 800° C., the concentration of the introduced negative hydrogen will be reduced to less than $1\times10^{18}$ cm$^{-3}$, and therefore the intended characteristics cannot be adequately obtained.

While the cooling process may be a usual self-cooling in an electric furnace, it is preferable to quench or rapidly cool the heat-treated material. In particular, when the heat treatment is performed at a relatively low temperature, the heat-treated material is rapidly cooled to allow the concentration of the negative hydrogen ion to be $1\times10^{18}$ cm$^{-3}$ or more.

Figure 2:
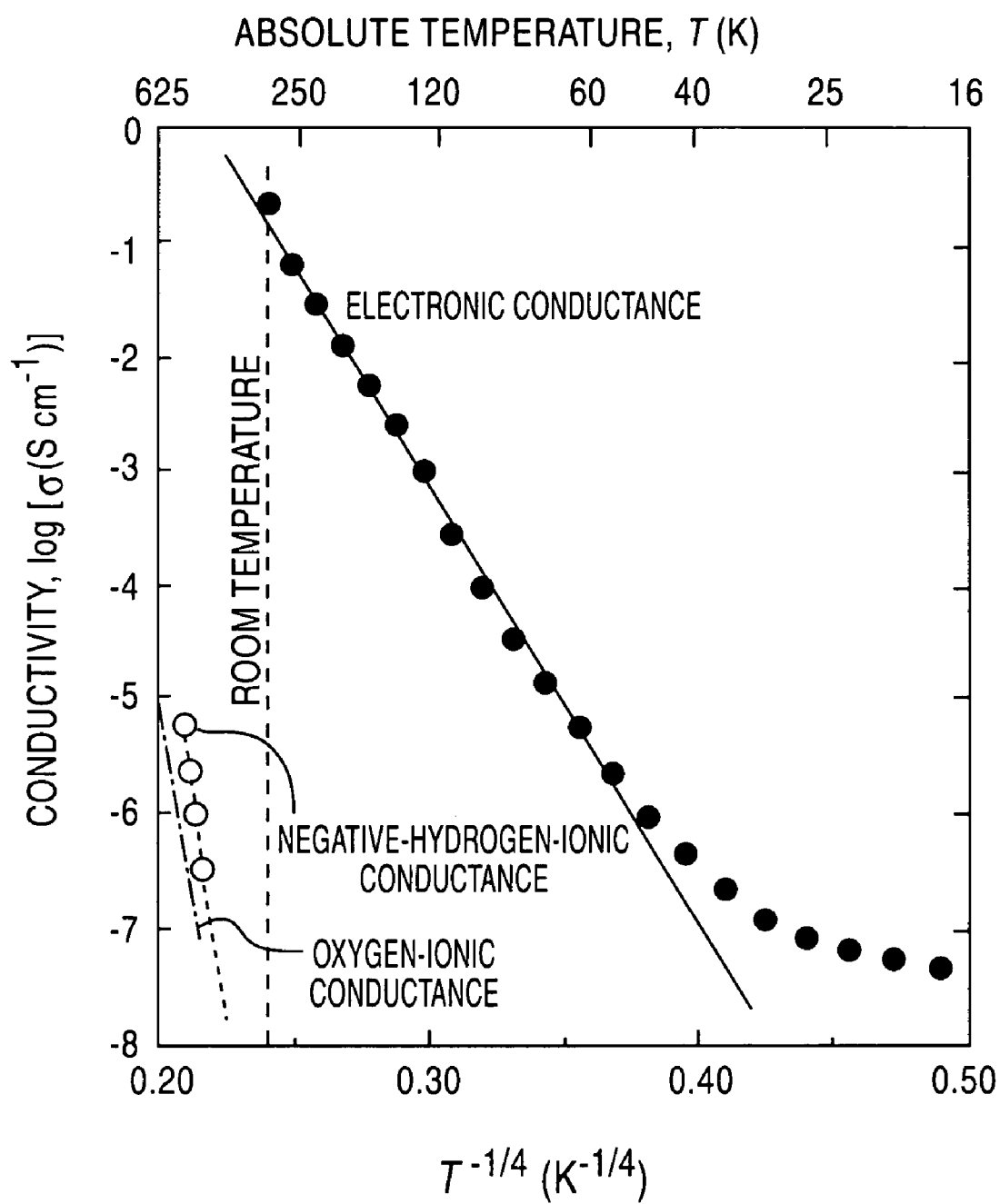
FIG. 2 is a graph showing the respective temperature dependences of electronic conductance and ionic conductance in a single crystal obtained in Example 2 (wherein the vertical axis represents the logarithm of conductivity, and the horizontal axis represents the $-\frac{1}{4}$ power of absolute temperature).

The material after completion of the above high-temperature treatment is in an insulative material having an electric conductivity of $10^{-10}$ Scm$^{-1}$ or less. When the starting material of the treated material is made of pure C12A7, the treated material is transparent and colorless. Then, in response to irradiating the treated material with ultraviolet light having a wavelength of about 300 nm, the conductivity starts increasing, and the irradiated material will exhibit an electronic conductance of about 1 Scm$^{-1}$ at the time the increase is saturated. When the starting material of the irradiated material is made of pure C12A7, the irradiated material will concurrently have a color ranging from yellowish green to dark green. FIG. 1 shows the change in optical absorption spectrum and the sensitivity to the wavelength of the radiated ultraviolet light in this irradiation process. FIG. 2 shows data about electronic conductivity.

If the radiated light has a photon energy of less than 2 eV, it cannot act on the negative hydrogen ion, or cannot increase the electronic conductance. Further, if the radiated light has a photon energy of 5 eV or more, it cannot efficiently act on the negative hydrogen ion due to light absorption of the C12A7 crystal itself. The heat-treated material may also be irradiated with X-ray having far higher photon energy. In this case, the C12A7 crystal itself does not absorb the light. Thus, the X-ray can act on the negative hydrogen ion to increase the electronic conductance and develop a color of dark green.

In response to the ultraviolet acting on the negative hydrogen ion, an electron is released. The released electron is mildly confined within a cage in the crystal in an F$^+$ center-like state. The electron (conduction carrier) of F$^+$ center migrates within the crystal while hopping across cages to thereby generate an electron conductance. Such electronically conductive state is maintained in a sustained manner at a room temperature, and any significant change will not be observed even after left at the room temperature for one month. That is, a sustained electronic conductance can be obtained. A sufficient electronic conductance equivalent to an electronic conductivity of $10^{-5}$ Scm$^{-1}$ or more can be generated only if the negative hydrogen ion serving as a source of the conduction carrier is contained in the treated material at a concentration of $1\times10^{18}$ cm$^{-3}$ or more, preferably $1\times10^{19}$ cm$^{-3}$ or more.

The state after the negative hydrogen ion is contained or introduced in the treated material means that the negative hydrogen ion is confined in the inner space of the cages of the C12A7 crystal. It is known that the unit lattice of the C12A7 crystal has a lattice constant of 1.119 nm, and a composition expressed by $[Ca_{24}Al_{28}O_{64}]^{4+}$. Given that a positive charge of +4 per unit lattice is entirely covered by the introduction of the negative hydrogen ion, it can be calculated that the number of negative hydrogen ions contained in the C12A7 crystal is a maximum of $2.3\times10^{21}$/cubic centimeter.

Figure 3:
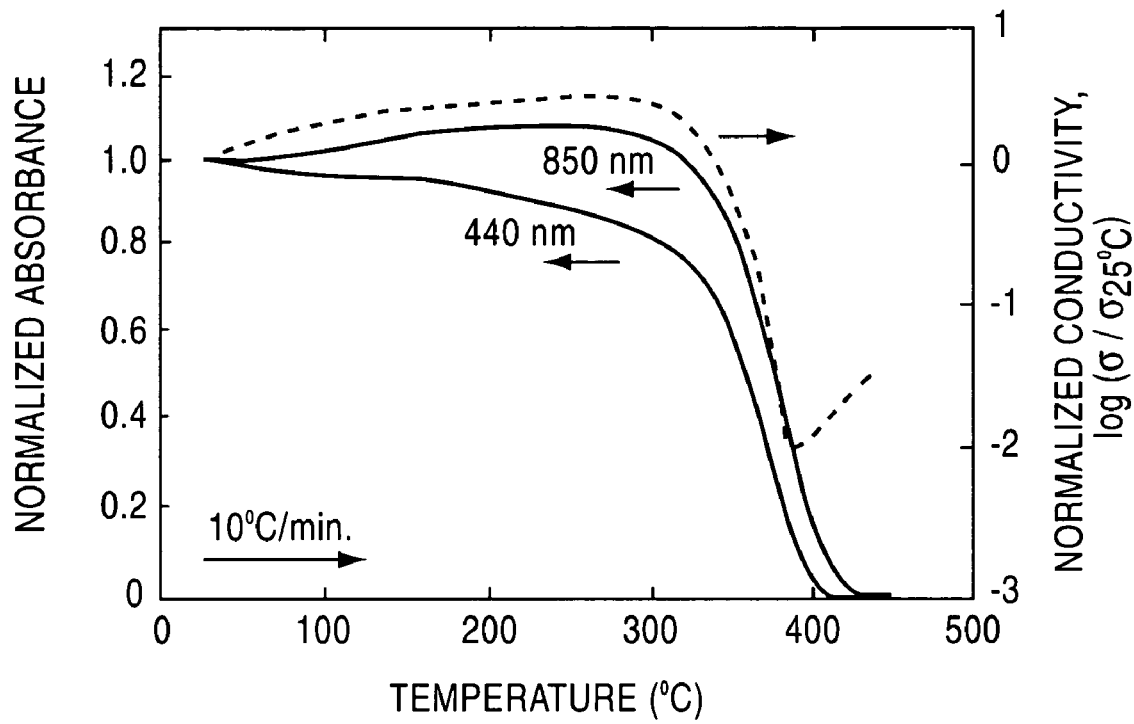
FIG. 3 is a graph showing the respective changes of absorbance and electric conductivity relative to temperature in a single crystal obtained in Example 3 (each value is normalized by a value at 25° C.).

If the irradiated material in the electronically conductive state is heated to have a temperature of 200° C. or more, preferably 450° C., it will be returned to a transparent/colorless insulative material, as shown in FIG. 3 (which shows the respective changes of absorbance and electric conductivity relative to temperature in a single crystal obtained in Example 3). Further, if this insulative material is re-irradiated with ultraviolet ray or X-ray at a relatively low temperature of 200° C. or less, a colored conductive material can be obtained again. This conversion between the two state of the insulative material and the electronically conductive material can be repeatedly carried out. The heating at a temperature of 550° C. or more causes disappearance of the negative hydrogen ion from the crystal, resulting in neither generation of electronic conductance by means of irradiation with ultraviolet light nor color development. In the colored state, both the electronic conductance and color can also be erased by irradiating the material with high-intensity light having a wavelength corresponding to the color absorption band.

The above treated material exhibits no electronic conductance without irradiation with ultraviolet light. In this specification, this state is referred to as "insulative state" or "insulative material". As shown in FIG. 2, the material in the insulative state exhibits an ionic conductance derived from the negative hydrogen ion at a temperature of greater than the room temperature. While the insulative material has an ionic conductivity of $10^{-10}$ Scm$^{-1}$ or less at the room temperature, it exhibits an ionic conductance equivalent to an ionic conductivity of about $10^{-4}$ Scm$^{-1}$. This ionic conductivity has a digit number greater by about one than that of the ionic conductance exhibited by a conventional C12A7 compound. If this conductive material is heated up to a temperature of 550° C. or more where the negative hydrogen ion is to be lost, the ionic conductance derived from the negative hydrogen ion will be lost, and any increase in electronic conductance by means of irradiation with light will not be induced.

Figure 7:
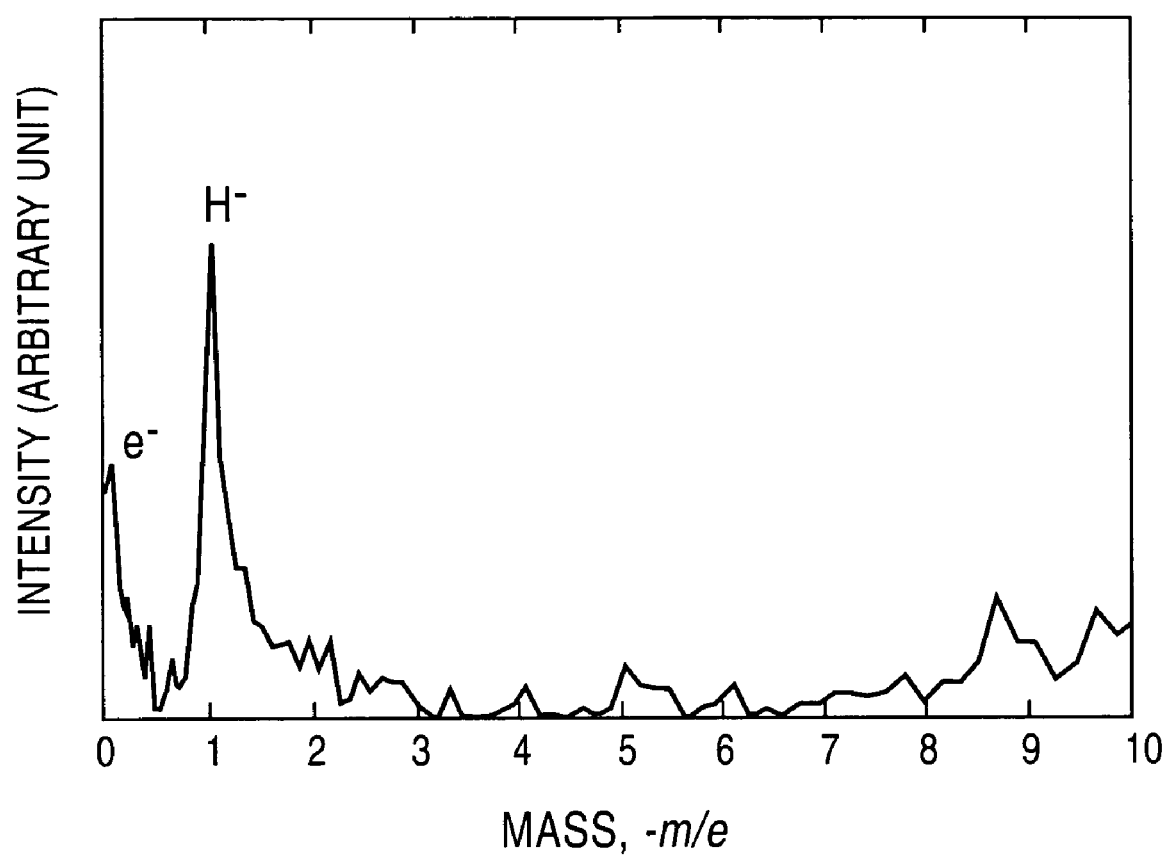
FIG. 7 is a graph showing a mass spectrum indicative of a hydride ion released from a polycrystal sample according to an electric field applied thereto.

The material is formed with a pair of positive and negative electrodes, respectively, on the opposite surfaces thereof. Then, a given voltage is applied between the electrodes to generate a negative hydrogen ion or hydrogen gas from the surface having the positive electrode. Alternatively, a first electrode is formed on one of the opposite surface of the material. Then, in vacuum or arbitrary atmosphere, a given voltage is applied between the first electrode and a second electrode disposed apart from the material by a given distance, in such a manner that the first electrode on the side of the material serves as a negative electrode, so as to release a hydride ion from the material as shown in FIG. 7.

EXAMPLE

The present invention will be described in more detail in connection with examples.

Example 1

A C12A7 single crystal prepared through a floating zone (FZ) process was formed into a plate-shaped sample having a mirror finished surface and a thickness of 300 μm. This sample was held in the flow of a mixed gas consisting of 20 volume % of hydrogen and 80 volume % of nitrogen, at 1300° C. for two hours, and then rapidly cooled in the same atmosphere. The heat-treated sample was irradiated with ultraviolet light of 254 nm (4.9 eV) at $1\times10^{20}$ photons/cm$^2$. FIG. 1 shows light absorption spectrums before and after the ultraviolet irradiation. The white circular marks in FIG. 1 indicate evaluated values of light absorption speed, or photosensitivity, obtained by changing the wavelength of ultraviolet light to be radiated.

Example 2

A C12A7 single crystal prepared through a floating zone (FZ) process was formed into a plate-shaped sample having a mirror finished surface and a thickness of 300 µm. This sample was held in the flow of a mixed gas consisting of 20 volume % of hydrogen and 80 volume % of nitrogen, at 1300° C. for two hours, and then rapidly cooled in the same atmosphere. The heat-treated sample was irradiated with light emitted from a Xe lamp at a light intensity of 0.5 W/cm$^2$ and subjected to a processing for eliminating a wavelength of 340 nm or more, for 30 minutes or more until the change in light absorption was saturated. The irradiated sample exhibited an enhanced electric conductivity having a digit number greater by about eight than that before the light irradiation. The change of electronic conductivity relative to temperature in the sample after the light irradiation is indicated by the block circular marks in FIG. 2. After completion of this measurement, the sample was heated up to 450° C., and returned to its original insulative state. At a room temperature, the sample exhibited an electric conductivity having a digit number reduced by about eight.

An ionic conductivity derived from a negative hydrogen ion in this state is indicated by the white circular marks in FIG. 2. Then, this single-crystal sample was held in the air at 800° C. for 2 hours, and then the ionic conductivity of the sample was measured. The measured ionic conductivity had a digit number reduced by about one. The change of ionic conductivity relative to temperature in this measurement is indicated by the one-dot chain line in FIG. 2.

Example 3

A C12A7 single crystal prepared through a floating zone (FZ) process was formed into a plate-shaped sample having a mirror finished surface and a thickness of 300 µm. This sample was held in the flow of a mixed gas consisting of 20 volume % of hydrogen and 80 volume % of nitrogen, at 1300° C. for two hours, and then rapidly cooled in the same atmosphere. The heat-treated sample was irradiated with light emitted from a Xe lamp at a light intensity of 0.5 W/cm$^2$ and subjected to a processing for eliminating a wavelength of 340 nm or more, for 4 minutes, and thereby converted to an electrically conductive material having a color. The respective changes of the absorbance and conductivity of this sample at 440 nm and 850 nm were measured while heating the sample from a room temperature at a heating rate of 10° C./min. FIG. 3 shows the measurement result. At about 400° C., the light absorption was lost, and the electronic conductivity was reduced. That is, the sample lost the color based on photosensitivity, and returned to the insulative state. The increase of conductivity at 400° C. or more is based on the negative-hydrogen-ionic conductance.

Example 4

Figure 4:
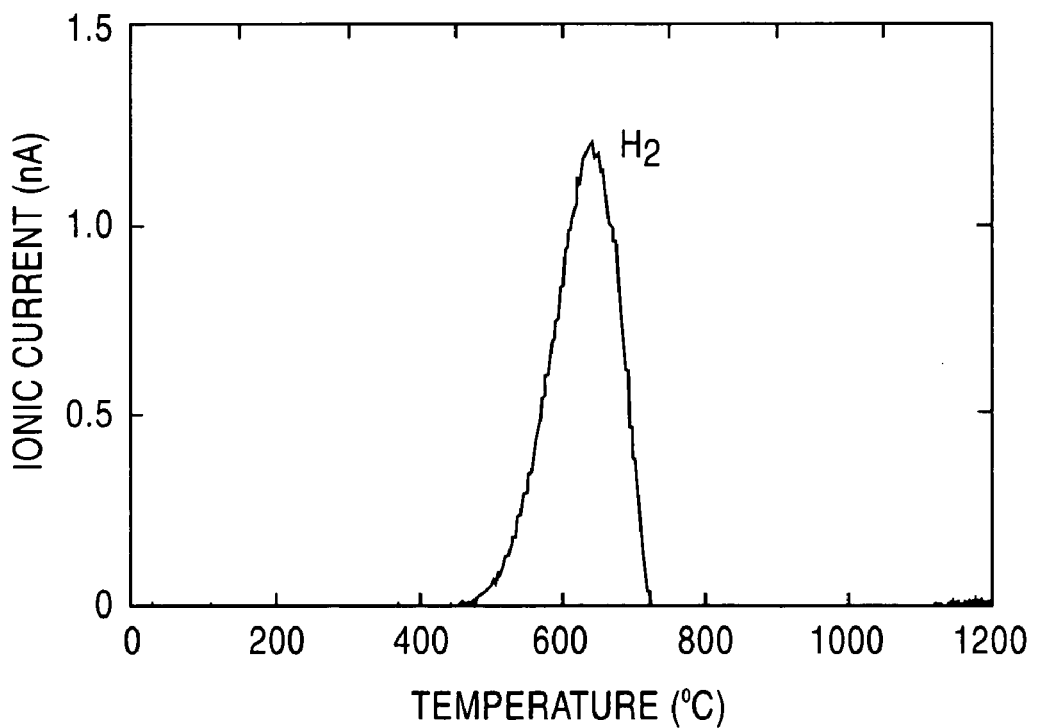
FIG. 4 is a graph showing the measurement result of hydrogen molecule in a polycrystal sample obtained in Example 4, which is detected by a thermogravimetric and mass spectrographic analysis.

A C12A7 polycrystal sample prepared through a solid-phase reaction process was held in the flow of a mixed gas consisting of 20 volume % of hydrogen and 80 volume % of nitrogen, at 1300° C. for two hours, and then rapidly cooled in the same atmosphere. The heat-treated sample was pounded to a slight degree in a mortar, and subjected to a thermogravimetric and mass spectrographic (TG-MS) analysis test performed at a heating rate of 110° C./m using He as a carrier gas. FIG. 4 shows the change in the ionic current density of ions having the value m/e=2 equivalent to a molecular hydrogen. At about 600° C., the release of molecular hydrogen in conjunction with the elimination of the negative hydrogen ion from the C12A7 crystal was notably observed.

Example 5

A C12A7 single crystal prepared through a floating zone (FZ) process was formed into a plate-shaped sample having a mirror finished surface and a thickness of 300 µm. This sample was subjected to a heat treatment in an oxygen atmosphere at 1350° C. for 6 hours (sample A). Subsequently, the sample A was held in the flow of a mixed gas consisting of 20 volume % of hydrogen and 80 volume % of nitrogen, at 1300° C. for two hours, and then rapidly cooled in the same atmosphere, so as to introduce a negative hydrogen ion into the C12A7 crystal (sample B). Subsequently, the sample B was heated in the air to have a temperature of 800° C. and then cooled to eliminate the negative hydrogen ion or convert the negative hydrogen ion to a hydroxyl group (sample C). The respective hydroxyl group (OH$^-$) concentrations of the samples A to C were determined from the infrared absorption intensity at 3560 cm$^{-1}$. This calculation was performed using a molar absorbance coefficient of 90 mol$^{-1}$ dm$^3$ cm$^{-1}$. Further, the concentration of the total amount of hydrogen contained in each of the samples A to C was quantitatively measured through secondary ion mass spectrometry (SIMS).

Figure 5:
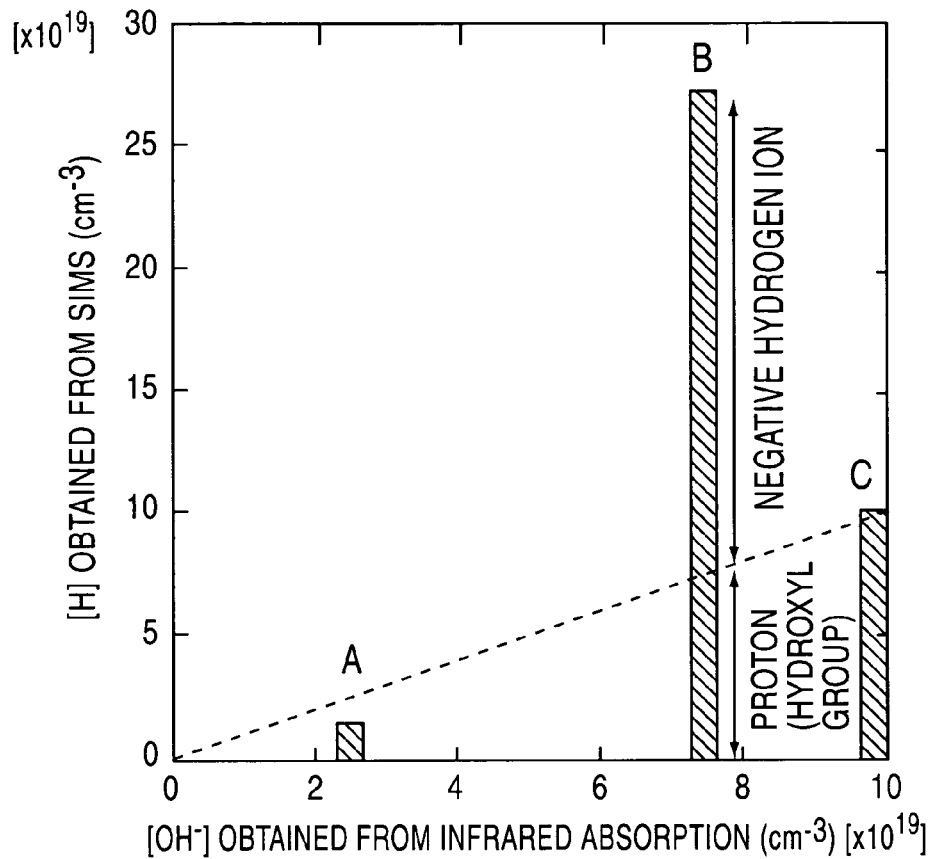
FIG. 5 is a graph showing a method of quantitatively determining a negative hydrogen ion concentration shown in Example 5.
Figure 6:
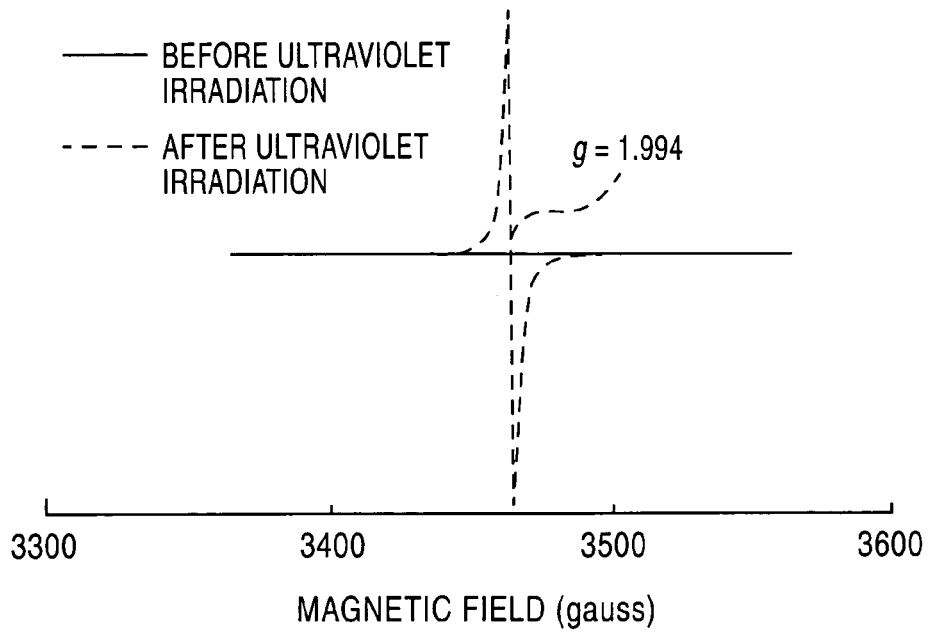
FIG. 6 is a graph showing an electron spin resonance spectrum of a polycrystal obtained in Example 6.

In the samples A and C, almost the entire hydrogen forms hydroxyl groups as protons. In the sample B, the hydrogen exists in the form of not only a proton but also a negative hydrogen ion. The concentration of the negative hydrogen ion in the sample B can be estimated from an analytical curve of proton concentration determined by the infrared absorption intensities and the quantitative values obtained through the SIMS in the samples A and C. This calculation method is shown in FIG. 5. The concentration of hydrogen existing in the sample B in the form of a negative hydrogen ion was estimated to be $2 \times 10^{20}$ cm$^{-3}$.

Example 6

A C12A7 polycrystal sample prepared through a solid-phase reaction process was held in the flow of a mixed gas consisting of 20 volume % of hydrogen and 80 volume % of nitrogen, at 1300° C. for two hours, and then rapidly cooled in the same atmosphere. The heat-treated sample was pounded to a slight degree in a mortar, and then irradiated with ultraviolet light from a mercury lamp until the photosensitivity was saturated. The respective states of the sample before and after the ultraviolet irradiation were evaluated by electron spin resonance. No signal was observed before the ultraviolet irradiation. After the ultraviolet irradiation, a signal of g=1.994 to 1.990 was observed. It is believed that this signal is caused by F$^+$ center. Considering in combination with the temperature dependence of electric conductance obtained in Example 2, it is believed that the electric conductance in this sample is caused by the variable-range hopping in an electron of F$^+$ center.

Example 7

A pellet-shaped C12A7 polycrystal sample prepared through a solid-phase reaction process was held in the flow of a mixed gas consisting of 20 volume % of hydrogen and 80 volume % of nitrogen, at 1300° C. for two hours, and then rapidly cooled in the same atmosphere. The heat-treated sample was held on a negative electrode placed on a vacuum tank, and a positive electrode was disposed at a position apart from the sample by about 1 cm. Then, an electric field of 300

V·cm$^{-1}$ was applied between the electrodes heating the sample at 710° C. A mass spectrum of ions released from the sample during the application of the electric field was measured using a time-of-flight mass spectrometer (TOF-MS). The measurement result is shown in FIG. 7.

Example 8

A plurality of pellet-shaped C12A7 polycrystal samples prepared through a solid-phase reaction process were subjected to a heat treatment in different hydrogen-containing atmospheres controlled at various temperatures as shown in Case Nos. 1 to 8 of Table 1, and cooled to a room temperature at various cooling rates. Each of the heat-treated samples was irradiated with ultraviolet light from a Xe lamp for about 30 seconds, and a resistance between two terminals spaced apart from one another by a distance of 2 mm was measured. Each of the resistance values in Table 1 is an electric resistance at a room temperature after the ultraviolet irradiation. Table 1 also shows the level of sensitivity to ultraviolet light (☻: high, ○: medium, x: none). As seen in Table 1, the polycrystal sample has a higher conductance in response to the ultraviolet irradiation as the sample is cooled at a higher cooling rate after subjected to a heat treatment in a hydrogen-containing atmosphere at a temperature of 800° C. or more.

sintered body as a target and an ArF excimer laser as a light source. This film was subjected to a heat treatment in the normal atmosphere at 1000° C., and thereby converted to a crystalline C12A7 thin film. Further, the crystalline thin film was held in an atmosphere consisting of 20 volume % of hydrogen and 80 volume % of nitrogen, at 1200° C. for 1 hour, and then rapidly cooled. Then, the one-half region of the obtained thin film was irradiated with ultraviolet light from a Xe lamp at a room temperature. As a result, the region irradiated with the ultraviolet light was a semiconductor material having a conductivity of 0.1 Scm$^{-1}$, and the remaining region without the irradiation was an insulative material having a conductivity of 10$^{-8}$ Scm$^{-1}$ or less. The thin film was transparent and colorless in appearance even after the ultraviolet irradiation. This proved that a transparent electronically conductive region can be formed on a transparent insulative thin film by means of irradiation with ultraviolet light.

INDUSTRIAL APPLICABILITY

While the material of the present invention in the form of a bulk crystal or polycrystal having a conductivity of about 1 Scm$^{-1}$ is stained green by irradiation with ultraviolet light, the material in the form of a thin film having a thickness of about 200 nm can be used as a colorless transparent electrode or

TABLE 1

| Case | Atmosphere | Heat Treatment | Cooling | Resistance | Sensitivity to Ultraviolet |
|---|---|---|---|---|---|
| 1 | 20% H$_2$—80% N$_2$ | 1300° C. × 2 h | slow cooling (200° C./h) | 10 kΩ | ☻ |
| 2 | 20% H$_2$—80% N$_2$ | 1300° C. × 2 h | furnace cooling (~600° C./h) | 8 kΩ | ☻ |
| 3 | 20% H$_2$—80% N$_2$ | 1300° C. × 2 h | rapid cooling (>50° C./h) | 7 kΩ | ☻ |
| 4 | 20% H$_2$—80% N$_2$ | 1100° C. × 2 h | furnace cooling (~600° C./h) | 13 kΩ | ○ |
| 5 | 20% H$_2$—80% N$_2$ | 800° C. × 2 h | furnace cooling (~600° C./h) | 10$^{10}$ Ω | x |
| 6 | 100% H$_2$ | 1300° C. × 2 h | rapid cooling (>50° C./h) | 8 kΩ | ☻ |
| 7 | 5% H$_2$—95% N$_2$ | 1300° C. × 2 h | rapid cooling (>50° C./h) | 7 kΩ | ☻ |
| 8 | 20% H$_2$—80% N$_2$ | 800° C. × 2 h | rapid cooling (>50° C./h) | 20 kΩ | ○ |

Example 9

A pellet-shaped C12A7 polycrystal sample prepared through a solid-phase reaction process was held in the flow of a mixed gas consisting of 20 volume % of hydrogen and 80 volume % of nitrogen, at 1300° C. for two hours, and then rapidly cooled in the same atmosphere. The heat-treated sample was an insulative material having a resistance of 50 MΩ or more between 2 mm-spaced terminals at a room temperature. Then, the sample was irradiated with X-ray having a photon energy of 1253.6 eV (target: Mg, filament current: 5A, acceleration voltage: 15 kV, cathode current: 5 mA) for 1 hour. The irradiated sample was stained dark green, and the resistance between 2 mm-spaced terminals was reduced to 10 kΩ so as to exhibit an electronic conductance.

Example 10

An amorphous C12A7 film having a thickness of 200 nm was deposited on a magnesium oxide single crystal substrate through a pulsed-laser deposition process using a C12A7 transparent wiring because it has a maximum absorption rate of about 1% in the visible region. Indium in indium oxides most frequently used as the material of transparent electrodes is a sparse resource. In contrast, calcium and aluminum are extremely easily obtainable materials, and significantly low in environmental load.

In the material of the present invention, a specific region in its insulative state can be selectively formed as an electrically conductive region by means of irradiation with ultraviolet light. Thus, the material can be exposed to light of a circuit pattern to form a 2-dimensional electronic circuit on the surface thereof. In addition, X-rays having a shorter wavelength can be used as a light source to form a further microscopic circuit pattern.

A laser beam can be focused on the inside of the material of the present invention by utilizing two-photon absorption according to a visible-light laser to freely form an optically writable 3-dimensional electronic circuit not only on the surface of the material but also in the inside of the material. The formed circuit pattern can be erased entirely or partly by means of irradiation with high-intensity light having a wavelength equivalent to a color absorption band, heating of the entire material, or Joule's heat arising from a large current applied to the circuit. That is, an optically writable and erasable 3-dimesional electronic circuit can be formed.

Based on the above writing and erasing means, the material of the present invention can be applied to a 3-dimensional storage element serving as a main component for a storage device, which has a plurality of access means, such as a writing means using ultraviolet light, a reading means using visible/infrared light or electric resistance, and an erasing means using current application, visible/infrared light radiation or heating.

In the material of the present invention, the characteristic as a ion-conductive material capable of conducting a negative hydrogen ion comprising a primary component of a hydride ion, and the characteristic capable of releasing the negative hydrogen ion to a vacuum space or an arbitrary atmosphere by means of an electric field can be utilized to perform a selective reduction reaction or hydrogenation reaction. That is, the material of the present invention can act as a negative hydrogen ion-conducting solid-electrolyte.

What is claimed is:

1. A $12CaO.7Al_2O_3$ compound, which incorporates a negative hydrogen ion ($H^-$, $H^{2-}$, $H_2^-$) at a concentration of $1\times10^{18}$ cm$^{-3}$ or more, which has an electronic conductance equivalent to an electric conductivity of $10^{-5}$ Scm$^{-1}$ or more at a room temperature.

2. A $12SrO.7Al_2O_3$ compound, which incorporates a negative hydrogen ion ($H^-$, $H^{2-}$, $H_2^-$) at a concentration of $1\times10^{18}$ cm$^{-3}$ or more, which has an electronic conductance equivalent to an electric conductivity of $10^{-5}$ Scm$^{-1}$ or more at a room temperature.

3. A mixed crystal compound of $12CaO.7Al_2O_3$ and $12SrO.7Al_2O_3$, which incorporates a negative hydrogen ion ($H^-$, $H^{2-}$, $H_2^-$) at a concentration of $1\times10^{18}$ cm$^{-3}$ or more, which has an electronic conductance equivalent to an electric conductivity of $10^{-5}$ Scm$^{-1}$ or more at a room temperature.

4. A method of producing the compound as defined in claim 1, comprising subjecting a $12CaO.7Al_2O_3$ compound, to a heat treatment at a temperature of 800° C. or more in an atmosphere containing 1000 ppm or more of hydrogen, to thereby clathrate a negative hydrogen ion ($H^-$, $H^{2-}$, $H_2^-$) into said selected compound at a concentration of $1\times10^{18}$ cm$^{-3}$ or more, and further irradiate said selected compound with ultraviolet ray or X-ray.

5. A method of producing the compound as defined in claim 2, comprising subjecting a $12SrO.7Al_2O_3$ compound to a heat treatment at a temperature of 800° C. or more in an atmosphere containing 1000 ppm or more of hydrogen, to thereby clathrate a negative hydrogen ion ($H^-$, $H^{2-}$, $H_2^-$) into said selected compound at a concentration of $1\times10^{18}$ cm$^{-3}$ or more, and further irradiate said selected compound with ultraviolet ray or X-ray.

6. A method of producing the compound as defined in claim 3, comprising subjecting a mixed crystal compound of $12CaO.7Al_2O_3$ and $12SrO.7Al_2O_3$ to a heat treatment at a temperature of 800° C. or more in an atmosphere containing 1000 ppm or more of hydrogen, to thereby clathrate a negative hydrogen ion ($H^-$, $H^{2-}$, $H_2^-$) into said selected compound at a concentration of $1\times10^{18}$ cm$^{-3}$ or more, and further irradiate said selected compound with ultraviolet ray or X-ray.

7. The compound as defined in any one of claims 1 to 3, wherein the compound is included in a transparent electrode or wiring.

8. The compound as defined in any one of claims 1 to 3, wherein the compound is included in an optically writable and erasable 3-dimensional electronic circuit and 3-dimensional storage element.

9. The compound as defined in any one of claims 1 to 3, wherein the compound is included in a negative-hydrogen-ion-conducting solid-electrolyte.

* * * * *